(12) United States Patent
Shibata

(10) Patent No.: US 10,884,517 B2
(45) Date of Patent: Jan. 5, 2021

(54) INPUT DEVICE AND ELECTRONIC APPARATUS COMPRISING SAME

(71) Applicant: Panasonic Intellectual Property Management Co., Ltd., Osaka (JP)

(72) Inventor: Katsuya Shibata, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/286,561

(22) Filed: Feb. 26, 2019

(65) Prior Publication Data

US 2019/0196614 A1    Jun. 27, 2019

Related U.S. Application Data

(63) Continuation of application No. PCT/JP2017/031867, filed on Sep. 5, 2017.

(30) Foreign Application Priority Data

Sep. 9, 2016   (JP) .................................. 2016-177061
Sep. 9, 2016   (JP) .................................. 2016-177064

(51) Int. Cl.
*G06F 3/0354*     (2013.01)
*G06F 3/023*      (2006.01)
(Continued)

(52) U.S. Cl.
CPC ............ *G06F 3/03547* (2013.01); *G06F 3/02* (2013.01); *G06F 3/0202* (2013.01); *G06F 3/023* (2013.01);
(Continued)

(58) Field of Classification Search
CPC .......... G06F 1/169; G06F 3/02; G06F 3/0202; G06F 3/0219; G06F 3/0224;
(Continued)

(56) References Cited

U.S. PATENT DOCUMENTS

| | | | |
|---|---|---|---|
| 6,204,839 B1 * | 3/2001 | Mato, Jr. ............... | G06F 1/1616 341/22 |
| 2006/0283698 A1 * | 12/2006 | Huang ................... | H01H 13/83 200/310 |

(Continued)

FOREIGN PATENT DOCUMENTS

| | | |
|---|---|---|
| JP | 2008-033843 | 2/2008 |
| JP | 2011-222226 | 11/2011 |

(Continued)

OTHER PUBLICATIONS

International Search Report of PCT application No. PCT/JP2017/031867 dated Oct. 10, 2017.

*Primary Examiner* — Nathan Danielsen
(74) *Attorney, Agent, or Firm* — Wenderoth, Lind & Ponack, L.L.P.

(57) ABSTRACT

An input device of the present disclosure includes an electrode sheet, a plurality of keys, and a controller. The electrode sheet directly senses a change in capacitance at a position where an object approaches when the object approaches the electrode sheet. The plurality of keys are depressibly disposed on the electrode sheet. The controller detects capacitance change amounts at a plurality of positions on the electrode sheet, outputs positional information indicating the position, among the plurality of positions, at which a capacitance change amount detected satisfies a first given condition, and outputs key information indicating a key among the plurality of keys corresponding to the position, among the plurality of positions, at which a capacitance change amount detected satisfies a second given condition.

11 Claims, 14 Drawing Sheets

(51) Int. Cl.
*H03M 11/14* (2006.01)
*G06F 3/044* (2006.01)
*H03K 17/96* (2006.01)
*H03K 17/975* (2006.01)
*G06F 3/02* (2006.01)
*G06F 3/041* (2006.01)
*G06F 1/16* (2006.01)

(52) U.S. Cl.
CPC ............ *G06F 3/044* (2013.01); *G06F 3/0412* (2013.01); *G06F 3/0443* (2019.05); *H03K 17/96* (2013.01); *H03K 17/975* (2013.01); *H03M 11/14* (2013.01); *G06F 1/169* (2013.01); *G06F 2203/04101* (2013.01)

(58) Field of Classification Search
CPC ...... G06F 3/0227; G06F 3/023; G06F 3/0233; G06F 3/0237; G06F 3/0238; G06F 3/033; G06F 3/0354; G06F 3/03547; G06F 3/0412; G06F 3/0414; G06F 3/04144; G06F 3/04146; G06F 3/044; G06F 3/0443; G06F 3/0448; G06F 2203/04101; G06F 2203/04102; G06F 2203/04106; G06F 2203/04108; H03M 11/02; H03M 11/04; H03M 11/06; H03M 11/10; H03M 11/14; H03K 17/96; H03K 17/9618–9622; H03K 17/965; H03K 17/967; H03K 17/975; H03K 17/98; H03K 2017/9602–9613
See application file for complete search history.

(56) References Cited

U.S. PATENT DOCUMENTS

| | | | |
|---|---|---|---|
| 2011/0050629 A1* | 3/2011 | Homma | G06F 3/0414 345/174 |
| 2013/0063286 A1* | 3/2013 | Elias | G06F 3/044 341/33 |
| 2013/0162450 A1* | 6/2013 | Leong | H01H 3/125 341/20 |
| 2017/0322647 A1 | 11/2017 | Katsuhara et al. | |
| 2017/0322663 A1* | 11/2017 | Lee | G06F 3/0416 |

FOREIGN PATENT DOCUMENTS

| | | |
|---|---|---|
| JP | 2012-038050 | 2/2012 |
| WO | 2016/075900 | 5/2016 |

\* cited by examiner

INPUT DEVICE AND ELECTRONIC APPARATUS COMPRISING SAME

BACKGROUND

1. Technical Field

The present disclosure relates to an input device and to an electronic apparatus including the input device.

2. Description of the Related Art

A notebook computer often includes a touchpad as a pointing device besides a keyboard for entering data such as text information. Such a keyboard and a touchpad are typically disposed side by side on the top surface of the cabinet of the main unit.

PTL 1 discloses a configuration in which a keyboard can be used as a pointing device as well to downsize a notebook computer (information terminal). Concretely, an information terminal of PTL 1 includes multiple depressible keys, a membrane switch disposed under the keys, and a sheet-like electrode (electrode sheet) disposed under the membrane switch sheet and changing its capacitance in response to the approach of a conductor. This information terminal outputs key information indicating a key and pointing information (positional information) indicating which position is pointed.

CITATION LIST

Patent Literature

PTL 1: Japanese Patent Unexamined Publication No. 2012-38050

SUMMARY

The inventor of the patent application has verified that an information terminal (input device) described in PTL 1 sometimes fails to output key information and/or positional information due to inappropriate change of the capacitance.

The present disclosure provides an input device that appropriately outputs key information indicating a key and positional information indicating a position that an object such as a finger has approached, and an electronic apparatus including the input device.

An input device of the present disclosure includes an electrode sheet, a plurality of keys, and a controller. The electrode sheet directly senses a change in capacitance at a position where an object approaches when the object approaches the electrode sheet. The plurality of keys are depressibly disposed on the electrode sheet. The controller detects capacitance change amounts at a plurality of positions on the electrode sheet, outputs positional information indicating the position, among the plurality of positions, at which a capacitance change amount detected satisfies a first given condition, and outputs key information indicating a key among the plurality of keys corresponding to the position, among the plurality of positions, at which a capacitance change amount detected satisfies a second given condition.

An input device of another embodiment of the present disclosure includes an electrode sheet, a plurality of keys, a membrane switch sheet, and a controller. The electrode sheet directly senses a change in capacitance at a position where an object approaches when the object approaches the electrode sheet. The plurality of keys are depressibly disposed on the electrode sheet. The membrane switch sheet is disposed under the electrode sheet and includes a plurality of switches that enter an on state when a corresponding key among the plurality of keys is depressed. The controller outputs key information indicating a key among the plurality of keys corresponding to a switch, among the plurality of switches, that has entered an on state, and detects a capacitance change amounts at a plurality of positions on the electrode sheet and outputs positional information indicating the position, among the plurality of positions, at which a capacitance change amount detected satisfies a given condition.

An input device of the present disclosure eliminates the need for a membrane switch sheet. This results in the absence of a membrane switch sheet between fingers of a user operating keys and the electrode sheet. Accordingly, a change amount of the capacitance can be detected appropriately using the electrode sheet. Hence, a change amount of the capacitance detected allows outputting key information indicating a key and positional information indicating a position that an object (e.g., a finger) has approached. Also, the absence of a membrane switch sheet simplifies the structure of the input device.

In an input device of another embodiment of the present disclosure, a membrane switch sheet is disposed under the electrode sheet. This results in the absence of a membrane switch sheet between fingers of a user operating keys and the electrode sheet. Accordingly, a change amount of the capacitance can be detected appropriately using the electrode sheet. Hence, a change amount of the capacitance detected allows outputting key information indicating a key and positional information indicating a position that an object (e.g., a finger) has approached.

DETAILED DESCRIPTION

Figure 1:
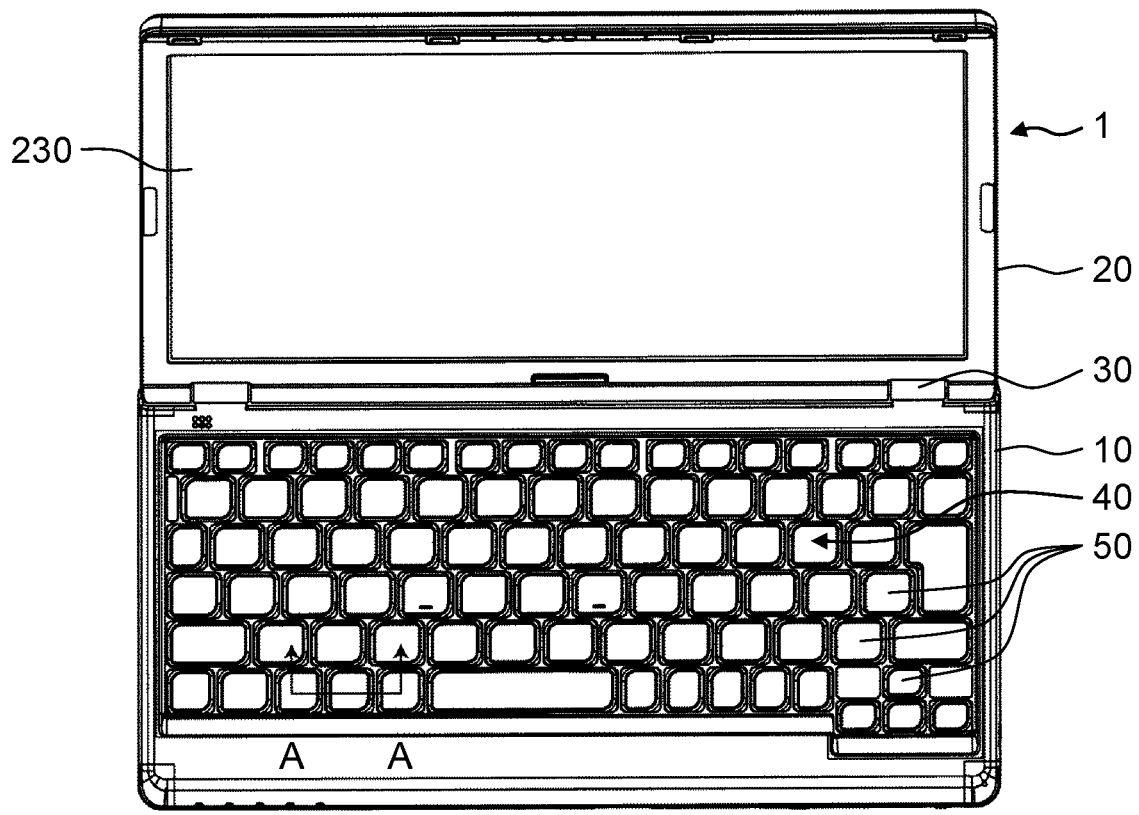
FIG. 1 is a plan view of an input device and a computer including the input device.

Hereinafter, a detailed description is made of some exemplary embodiments referring to the related drawings as appropriate. However, a detailed description more than necessary may be omitted, such as a description of a well-known item and a duplicate description for a substantially identical component, to avoid an unnecessarily redundant description and to allow those skilled in the art to easily understand the following description.

Note that the inventor provides the accompanying drawings and the following descriptions for those skilled in the art to well understand the disclosure and does not intend that the drawings and the description limit the subjects described in the claims.

BACKGROUND OF DISCLOSURE

As described under BACKGROUND, a notebook computer often includes a touchpad as a pointing device besides a keyboard for entering data such as text information. Such a keyboard and a touchpad are typically disposed side by side on the top surface of the cabinet of the main unit.

In such a configuration, when a cursor indicator (pointer) on the screen needs to be moved for example during text input using the keyboard, a hand needs to be moved onto the touchpad. After the pointer is moved, to input text again using the keyboard, the hand needs to be moved onto the keyboard. To sum up, when the operation is changed between key input and pointing, the hand unfortunately needs to be moved.

Meanwhile, in an information terminal, such as a tablet computer, that is provided with a touch panel over the display, the keyboard is often configured to be displayed on the screen to allow key input. In such a configuration, fewer hand movements described above are required. In a touchpanel keyboard, however, its keys do not move vertically, which does not provide an appropriate sense of typing to a user. This is unsuitable for a long-time typing.

If a keyboard is configured to be used as a pointing device as described in PTL 1, a hand does not need to be moved when the operation is changed between key input and pointing. Besides, the keys move vertically, which provides an appropriate sense of typing to a user.

However, as a result that the inventor of the patent application has verified the configuration described in PTL 1, it has been revealed that the capacitance sometimes fails to change on the electrode sheet appropriately even when a user's finger approaches a key top or the key is pressed in. In the configuration of PTL 1, the electrode sheet is disposed under the membrane switch sheet, and thus metal switches and wiring inside the membrane switch sheet are interposed between a finger of the user and the electrode sheet. Consequently, the capacitance between the finger and the electrode sheet sometimes fails to change appropriately even when the finger approaches a key top or the key is pressed in.

The present disclosure provides an input device that makes a keyboard function as a pointing device appropriately, and an electronic apparatus including the input device. An electronic apparatus of the present disclosure allows changing the capacitance appropriately when a user's finger approaches a key top or the key is pressed in. Furthermore, the electronic apparatus provides an appropriate sense of typing in key input.

First Exemplary Embodiment

Hereinafter, a description is made of the first embodiment in reference to the drawings.

1-1. Configuration

FIG. 1 is a plan view of an input device of the first embodiment and a computer including the input device.

As shown in FIG. 1, computer 1 is a notebook computer that includes main unit 10 and display unit 20. Computer 1 is an example of an electronic apparatus of the present disclosure. Display unit 20 is connected to main unit 10 with hinge 30 in an openable/closable manner. The top surface of main unit 10 is provided thereon with input device 40. Input device 40 functions as a keyboard device and a pointing device (hereinafter referred to as the pointing function as appropriate). Input device 40 is an example of an input device of the present disclosure. Display unit 20 is provided with display 230. Display 230 is a liquid crystal display (LCD) panel for example.

Figure 2A:
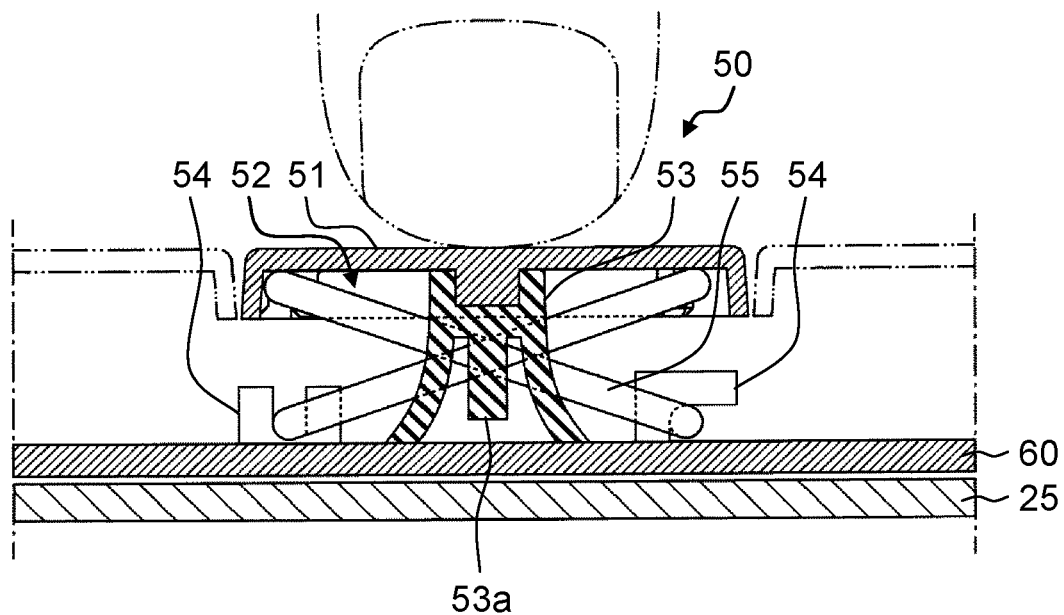
FIG. 2A is a figure viewing from the arrow direction of line A-A of FIG. 1 in the first to fourth embodiments, in the state where the key is not depressed.

FIG. 2A is a figure viewing from the arrow direction of line A-A of FIG. 1, in the state where the key is not depressed. In FIG. 2A, only one key 50 of multiple keys 50 is concretely shown with a solid line for convenience.

Input device 40 has multiple keys 50 disposed on the top surface of top cabinet 25 of main unit 10, and electrode sheet 60. Keys 50 and electrode sheet 60 are disposed in this order on the top surface of top cabinet 25 of main unit 10 of computer 1.

Each of keys 50 has key top 51, pantograph mechanism 52, and rubber cup 53.

Key top 51, formed of resin, bears characters and symbols on its top surface.

Pantograph mechanism 52 supports key top 51 movably up and down while keeping the top surface of key top 51 in parallel with electrode sheet 60. Pantograph mechanism 52 has link component 55 and support component 54. The components are formed of resin. The top end of link component 55 is connected to the bottom surface of key top 51, and the bottom end of link component 55 is supported by support component 54. Support component 54 is fastened to the top surface of electrode sheet 60 using an adhesive.

Rubber cup 53, which is made of rubber and has elasticity, is fastened to the top surface of electrode sheet 60 at the bottom end of rubber cup 53 using an adhesive for example.

The top end of rubber cup 53 is in contact with the bottom surface of key top 51 to urge key top 51 upward.

Electrode sheet 60, a rectangular sheet (panel) component made of resin or glass, is configured to change the capacitance at a position that an object such as a finger has approached. Electrode sheet 60 contains n pieces of X-directional electrodes and m pieces of Y-directional electrodes. Each of the X-directional electrodes extends substantially parallel with the widthwise direction of electrode sheet 60. Each of the Y-directional electrodes extends substantially parallel with the heightwise direction of electrode sheet 60.

Figure 2B:
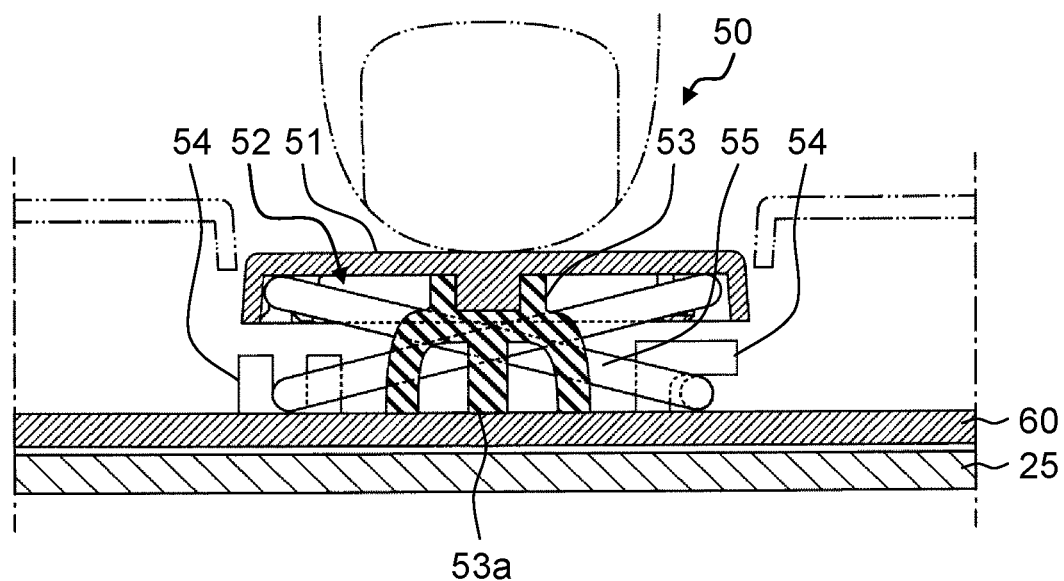
FIG. 2B is a figure viewing from the arrow direction of line A-A of FIG. 1 in the first to fourth embodiments, in the state where the key is depressed.

FIG. 2B is a figure viewing from the arrow direction of line A-A of FIG. 1, in the state where the key is depressed. In FIG. 2B, only one key 50 among multiple keys 50 is concretely shown with a solid line for convenience.

When key top 51 is pressed by a user's finger against an upward urging force caused by rubber cup 53, rubber cup 53 is compressed to move key top 51 downward, and the finger approaches electrode sheet 60.

When key top 51 is depressed to the height position (given height position) shown in FIG. 2B, a user's finger approaches electrode sheet 60. Herewith, the capacitance at a position (a position on the flat surface) corresponding to relevant key 50 in electrode sheet 60 increases with respect to the capacitance when an object such as a finger is absent around key top 51 (referred to as the normal state). The change amount of the capacitance at this moment corresponds to second given amount X2 (described later). Here, even when a user's finger approaches key top 51 close enough to contact it, the capacitance at a position corresponding to relevant key 50 in electrode sheet 60 increases with respect to the capacitance when an object such as a finger is absent around key top 51 (the normal state). The change amount of the capacitance at this moment is first given amount X1 (described later).

Figure 3:
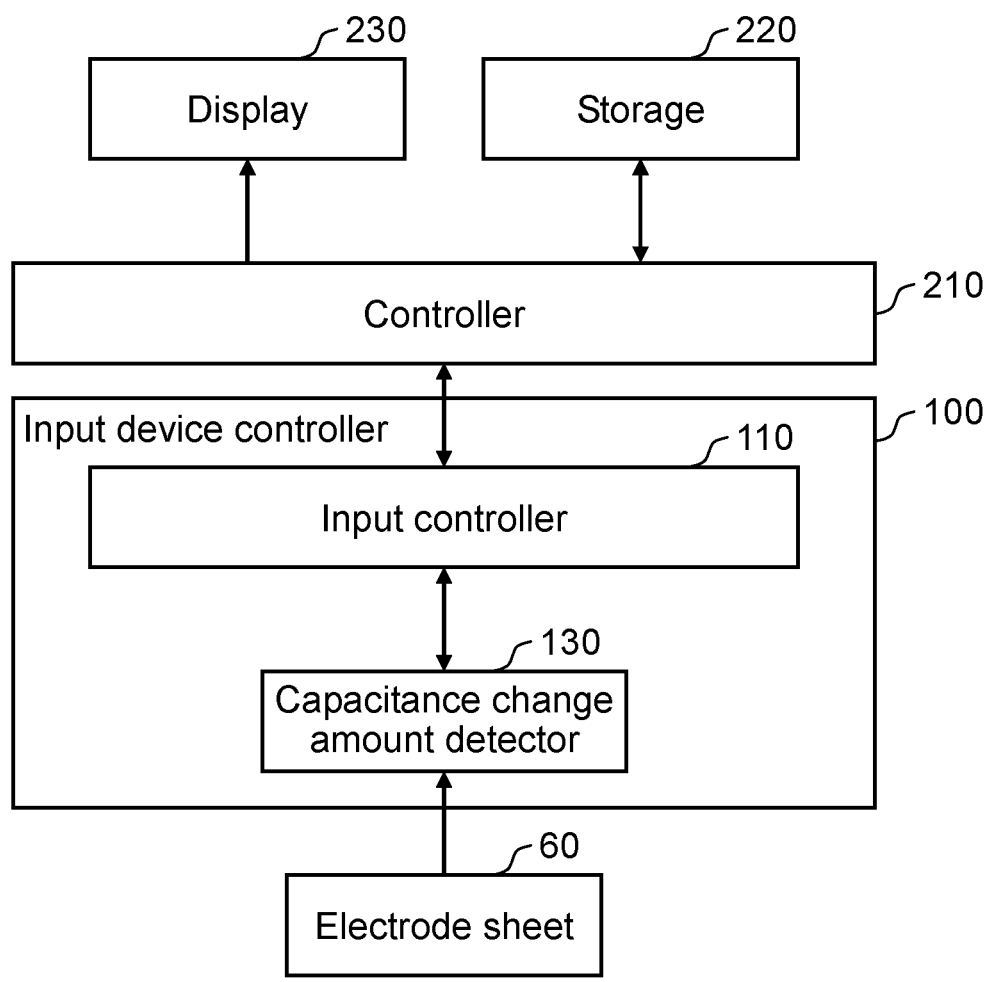
FIG. 3 is a block diagram illustrating the electrical configuration of the computer according to the first embodiment.

FIG. 3 is a block diagram illustrating the electrical configuration of computer 1 according to the first embodiment.

Computer 1 has controller 210 and storage 220 besides display 230 and input device 40 described above.

Storage 220 stores an OS, various application programs, and data.

Controller 210 performs operation using an OS and various application programs stored in storage 220 based on data stored in storage 220 and on key information and/or positional information that have been input from input controller 110 of input device controller 100 to implement various functions for generating various data and image signals.

Display 230 displays images based on image signals generated by controller 210.

Input device controller 100 has capacitance change amount detector 130 and input controller 110.

Capacitance change amount detector 130 successively applies drive voltage to n pieces of X-directional electrodes of electrode sheet 60, measures each voltage at m pieces of Y-directional electrodes, and calculates the capacitance at each position where each X-directional electrode crosses each Y-directional electrode based on measurement results. Capacitance change amount detector 130 determines capacitance change amount $X_i$ relative to the normal value for each capacitance determined. Here, the normal value of capacitance refers to, for example, capacitance at a position in a state where an object is not present near key 50. Capacitance change amount detector 130 further determines a coordinate in an XY coordinate system predetermined on electrode sheet 60, for a position having maximum capacitance change amount $X_m$ among multiple capacitance change amounts $X_i$ determined. In this example, the position having the maximum capacitance change amount $X_m$ is assumed to be a position where an object such as a finger is closely present. Capacitance change amount detector 130 outputs the coordinate of the position having the maximum capacitance change amount $X_m$ as positional information as well as the value of the maximum capacitance change amount $X_m$ as capacitance change amount X at the relevant coordinate.

Input controller 110 receives an input of positional information and capacitance change amount X from capacitance change amount detector 130. Input controller 110 outputs positional information or key information based on capacitance change amount X and positional information received. The following provides a detailed description about control by input controller 110 of input device controller 100.

1-2. Operation

Figure 4:
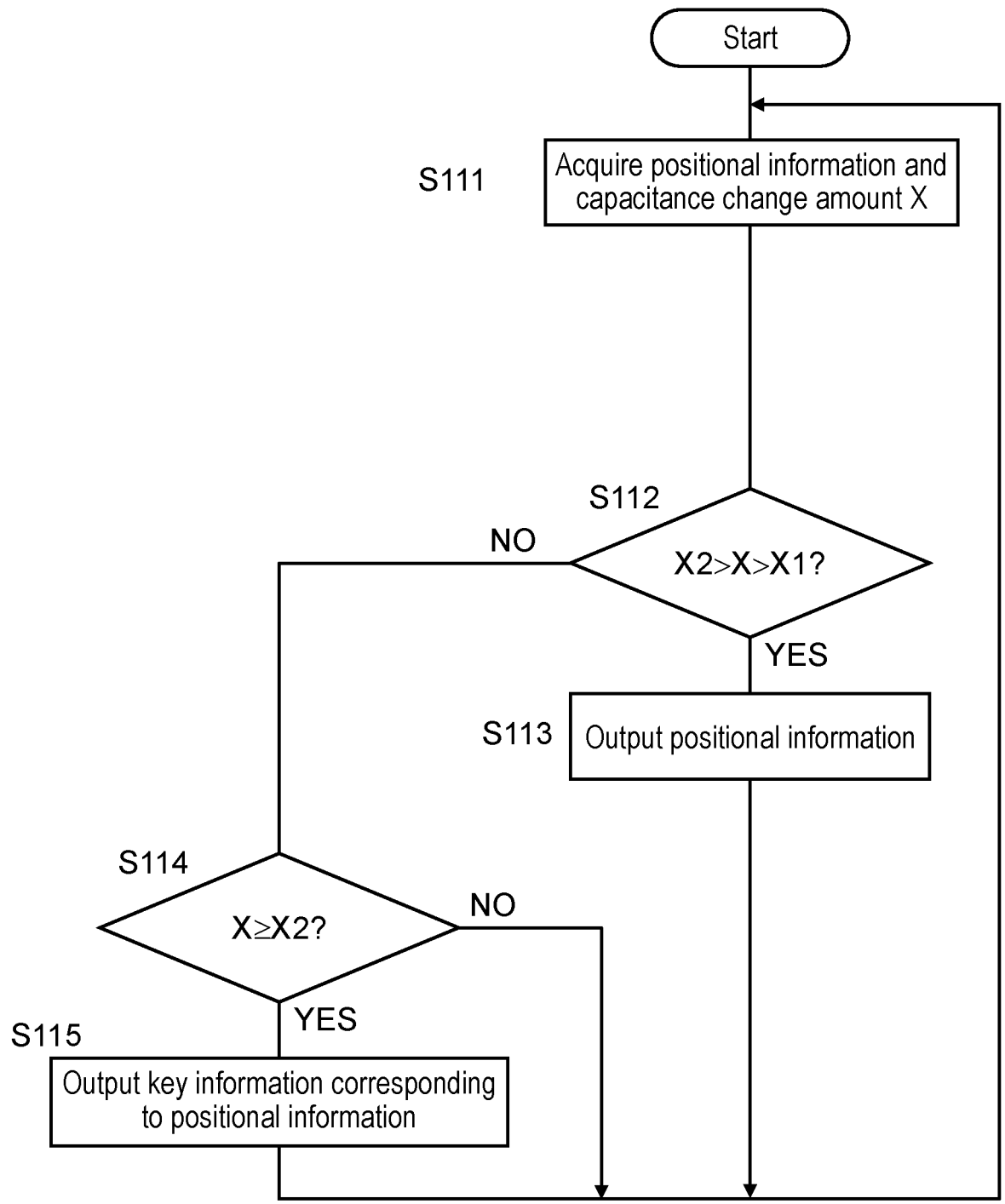
FIG. 4 is a flowchart illustrating the output control of positional information and key information by the input controller of the input device controller according to the first embodiment.

FIG. 4 is a flowchart illustrating output control of positional information and key information by input controller 110 of input device controller 100 according to the first embodiment. The process by input controller 110 based on the flowchart is executed in constant periods.

Input controller 110 of input device controller 100 acquires positional information and information on capacitance change amount X from capacitance change amount detector 130 (S111).

If capacitance change amount X acquired is smaller than second given amount X2 and is larger than first given amount X1 (a value within a predetermined range) (Yes in S112), input controller 110 outputs the positional information acquired (S113). If capacitance change amount X acquired is not within the predetermined range (No in S112), input controller 110 executes step S114 described later. Here, first given amount X1 is an amount of change in capacitance generated when a user's finger approaches the top surface of key 50 close enough to contact it. Second given amount X2 is an amount of capacitance change generated when key top 51 is depressed by a given stroke or more with a user's finger. A given stroke refers to a stroke that can be generated when key top 51 is intentionally depressed by a user against an upward urging force caused by elasticity of rubber cup 53.

In step S114, if capacitance change amount X acquired is equal to or larger than second given amount X2 (Yes in S114), input controller 110 outputs key information corresponding to the positional information acquired (S115). Here, input controller 110 stores key information on multiple keys and each range (a range of positional information (coordinate)) within which each of the keys is present correspondingly, and acquires key information indicating a key corresponding to a range including positional information acquired.

When receiving key information or positional information from input controller 110, controller 210 of computer 1 performs a process according to the information. When receiving key information for example, controller 210 generates a character based on the key information. Otherwise, if key 50 indicated by the key information is a special key such as a Return key or a Function key, controller 210 of computer 1 executes control corresponding to the special key pressed.

Besides, when receiving positional information from input controller 110, controller 210 of computer 1 moves the cursor (arrow indication) to a position corresponding to the positional information received, or performs other control operations. When continuously receiving positional information with its position continuously changing during operation of a browser or a document creation application, controller 210 of computer 1 scrolls the screen of the browser or the document creation application.

Figure 5:
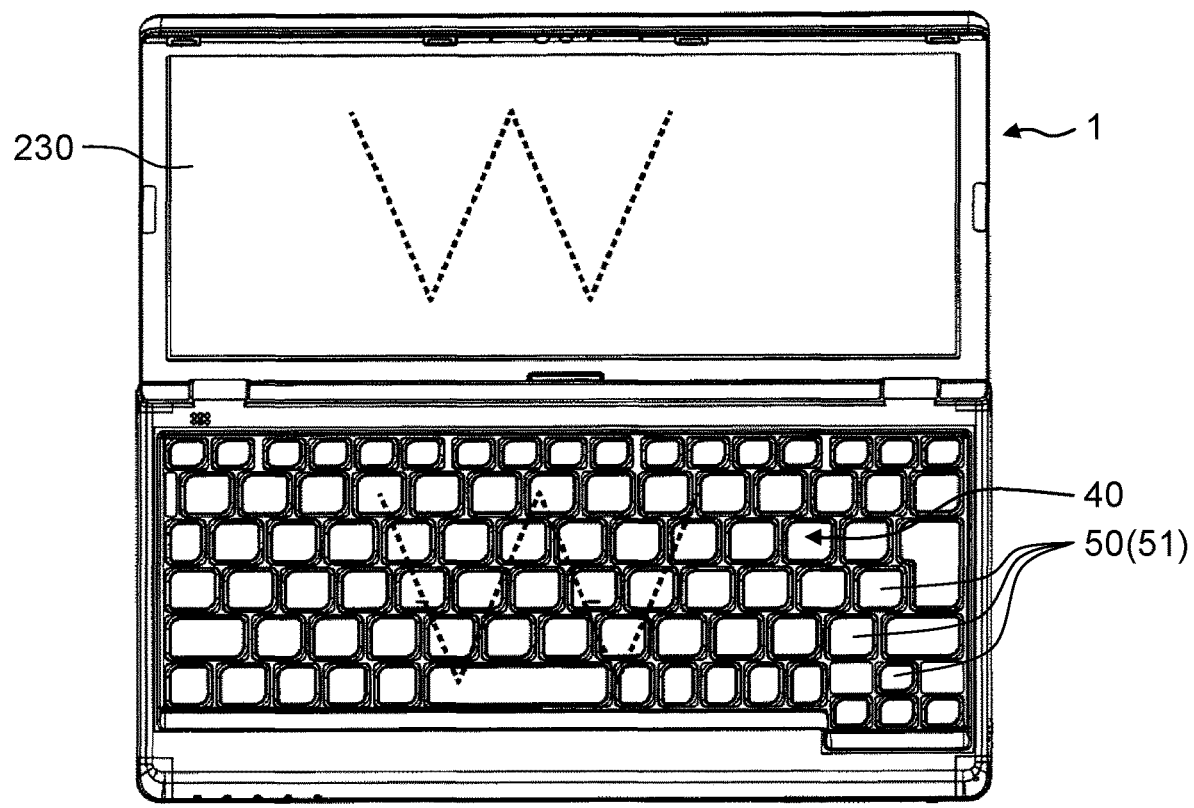
FIG. 5 schematically shows an example of operation of the computer according to the first embodiment.

FIG. 5 schematically illustrates an operation example of computer 1 according to the first embodiment.

A description is made of a case where a user slides a finger along the top surfaces of key tops 51 among multiple keys 50 of input device 40 in a W-shaped way. Capacitance change amount X at the position where the user slides the finger is larger than first given amount X1 and at the same time smaller than second given amount X2. Resultingly, input controller 110 successively outputs positional information indicating the position of the finger moving in a W-shaped way at the intervals of executing the process of the flowchart. Controller 210 of computer 1 moves the position of the cursor indicator on the screen of display 230 based on positional information output from input controller 110.

A description is made of a case where any one of keys 50 is depressed while a document creation application is running on computer 1. Capacitance change amount X at the position corresponding to key 50 depressed is equal to or larger than second given amount X2, and thus key information corresponding to key 50 depressed is output from input controller 110. Controller 210 of computer 1 generates a character based on the key information output from input controller 110 and makes display 230 display the character on the screen of the application.

This embodiment does not include a touchpad or a touchpad on-off switch that used to be provided in a previous notebook computer, which allows downsizing main unit 10 of computer 1. A computer without downsizing required may be provided with a touchpad and a touchpad on-off switch as in the conventional way.

An input device of PTL 1 has a membrane switch sheet disposed above the electrode sheet as described above. In this case, the capacitance of the electrode sheet can not change appropriately due to metal switches and wiring inside the membrane switch sheet. Input device 40 of this embodiment, however, is not provided with a membrane switch sheet. In other words, a membrane switch sheet is not interposed between a finger of a user operating keys and electrode sheet 60. Accordingly, capacitance change amount Xi can be appropriately detected using electrode sheet 60. This allows outputting appropriately key information indicating a key and positional information indicating a position that an object such as a finger has approached based on capacitance change amount Xi detected. Besides, a membrane switch sheet is unnecessary, thereby simplifying the structure of input device 40.

Second Exemplary Embodiment

Hereinafter, a description is made of the second exemplary embodiment in reference to some drawings.

When key 50 is depressed in the above-described first embodiment, positional information is output from input controller 110 after capacitance change amount X has exceeded first given amount X1 until capacitance change amount X becomes equal to or larger than second given amount X2. In this case, when key 50 is depressed, the cursor can move to a position corresponding to key 50 depressed, which may annoy the user. The second to fourth embodiments present techniques capable of handling this problem.

Figure 6:
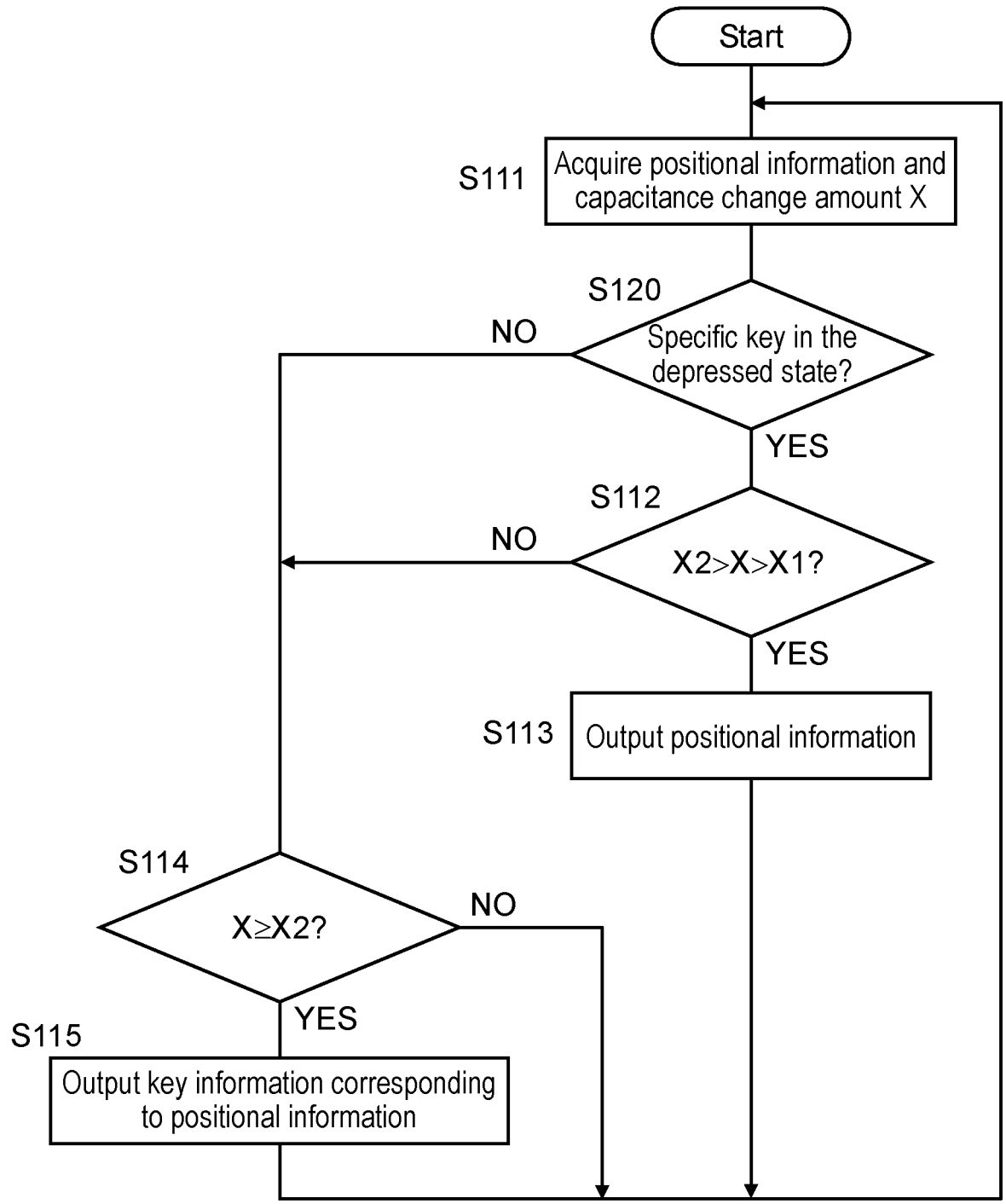
FIG. 6 is a flowchart illustrating the output control of positional information and key information by the input controller of the input device controller according to the second embodiment.

FIG. 6 is a flowchart illustrating output control of positional information and key information by input controller 110 of input device controller 100 according to the second embodiment. The process of input controller 110 based on this flowchart is executed in constant periods.

This embodiment has the process of step S120 added to the first embodiment. In steps S111 to S115, the same processes as those of the first embodiment are executed. Hereinafter, different processes are mainly described.

In step S120, input controller 110 of input device controller 100 determines whether or not specific key 50 is in the depressed state. Specific key 50 is a special key such as a Control key. Specific key 50 is an example of a given operation unit. The state where specific key 50 is depressed is an example of a given operation state. Whether or not specific key 50 is in the depressed state can be determined, based on whether or not specific key 50 is held down for a predetermined time or longer (e.g., 2 seconds or longer), for example by whether or not the capacitance at the position of specific key 50 is equal to or larger than second given amount X2 for the predetermined time or longer. The given operation unit may be a button or key specially provided. If specific key 50 is in the depressed state (Yes in S120), input controller 110 executes the process of step S112; otherwise (No in S120), executes the processes of step S114 and after.

According to this embodiment, positional information is to be output only when specific key 50 in the depressed state. This prevents input device 40 from being worked as a pointing device when a user desires only to input characters.

Third Exemplary Embodiment

Hereinafter, a description is made of the third exemplary embodiment in reference to some drawings.

Figure 7:
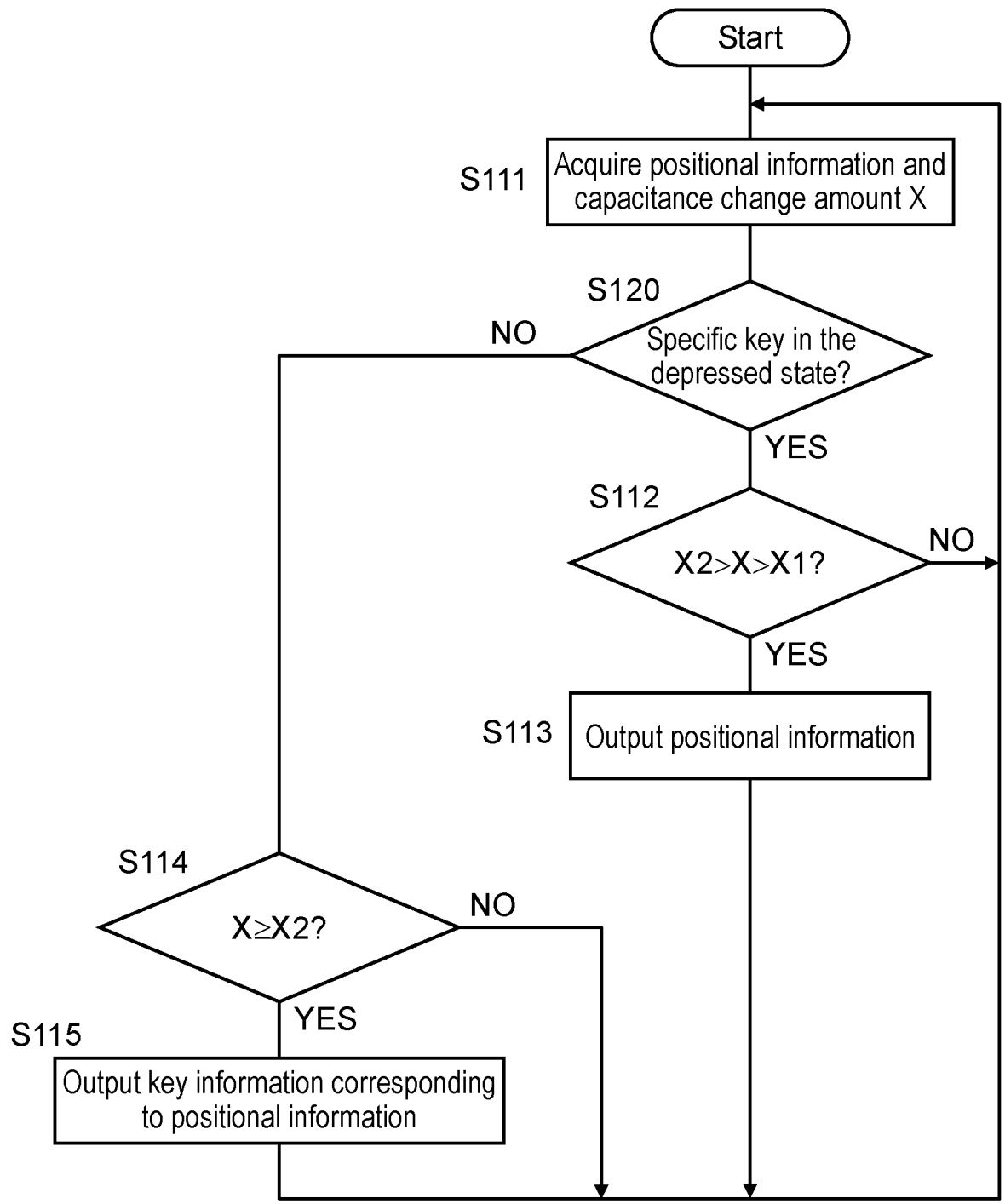
FIG. 7 is a flowchart illustrating the output control of positional information and key information by the input controller of the input device controller according to the third embodiment.

FIG. 7 is a flowchart illustrating output control of positional information and key information by input controller 110 of input device controller 100 according to the third embodiment. The process of input controller 110 based on this flowchart is executed in constant periods.

In this embodiment, the processes same as those of the second embodiment are executed basically. However, if capacitance change amount X acquired in step S112 is smaller than second given amount X2 and is not larger (within a predetermined range) than first given amount X1 (No in S112), input controller 110 does not execute the subsequent steps, but returns to the process of step S111.

According to this embodiment, depressing specific key 50 allows input device 40 only to be worked as a pointing device for inputting positional information. On the contrary, not depressing specific key 50 allows input device 40 only to be worked as a key-input device only for inputting characters. In any case, whether or not a pointing operation and a key-input operation have been performed can be appropriately determined based on capacitance change amount X in the same way as the first and second embodiments.

Fourth Exemplary Embodiment

Hereinafter, a description is made of the fourth exemplary embodiment in reference to some drawings.

Figure 8:
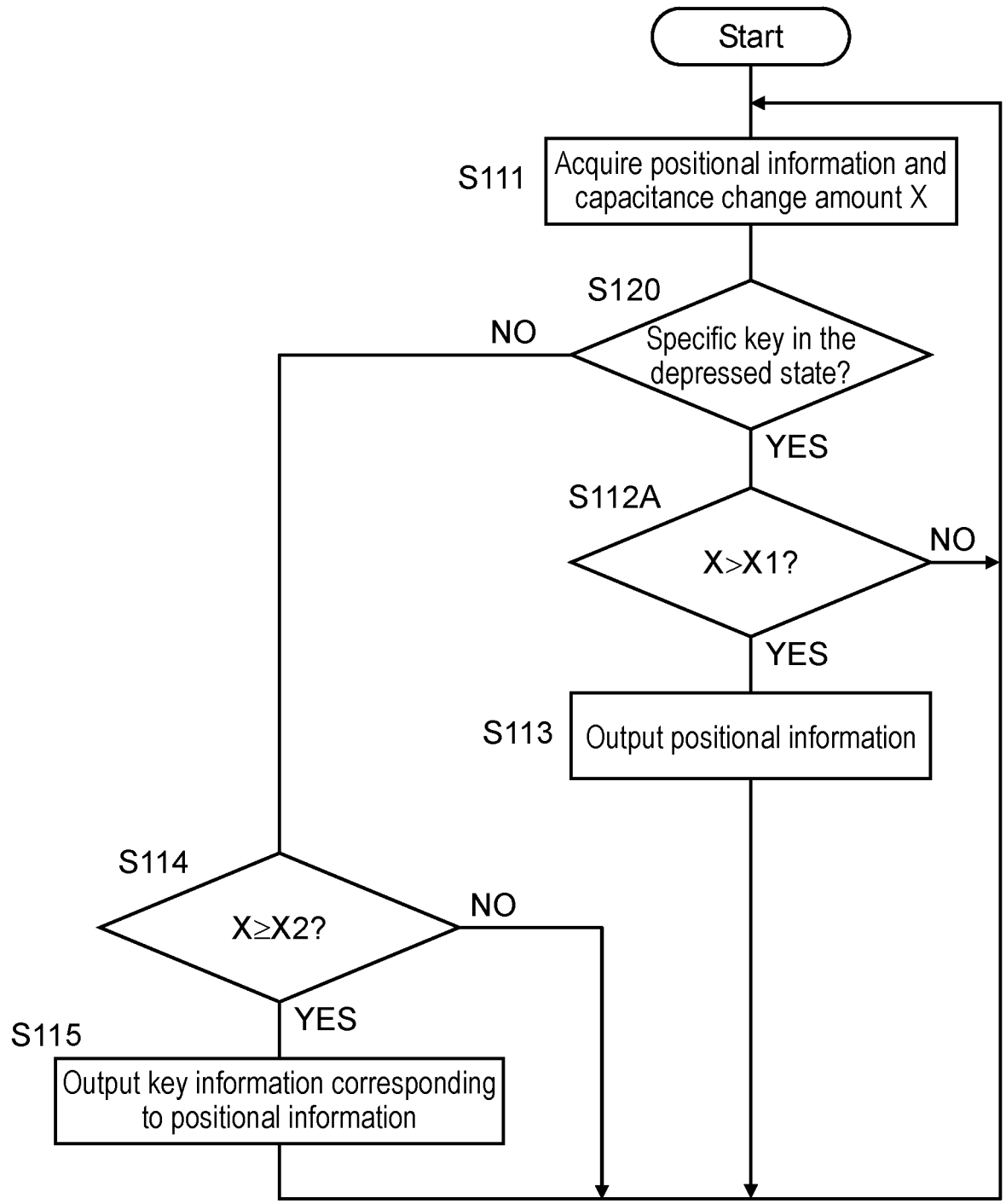
FIG. 8 is a flowchart illustrating the output control of positional information and key information by the input controller of the input device controller according to the fourth embodiment.

FIG. 8 is a flowchart illustrating output control of positional information and key information by input controller 110 of input device controller 100 according to the fourth embodiment. The process of input controller 110 based on this flowchart is executed in constant periods.

In this embodiment, the processes same as those of the third embodiment are executed. In step S112A, however, if capacitance change amount X acquired is larger than first given amount X1 (Yes in S112A), input controller 110 outputs positional information acquired (S113); otherwise (No in S112A), does not output positional information acquired, but returns to the process of step S111.

According to this embodiment, depressing specific key 50 allows input device 40 only to be worked as a pointing device for inputting positional information in the same way as the third embodiment. On the contrary, not depressing specific key 50 allows input device 40 only to be worked as a key-input device only for inputting characters. In particular, when specific key 50 is in the depressed state, positional information acquired is output even if capacitance change amount X acquired is larger than second given amount X2, which is larger than first given amount X1. Accordingly, even when the user has unconsciously pressed in key 50 deeply, positional information is output.

Fifth Exemplary Embodiment

Hereinafter, a description is made of the fifth exemplary embodiment in reference to some drawings. For configurations common to those of the first to fourth embodiment, their descriptions are omitted for easy understanding.

2-1. Configuration

Figure 9A:
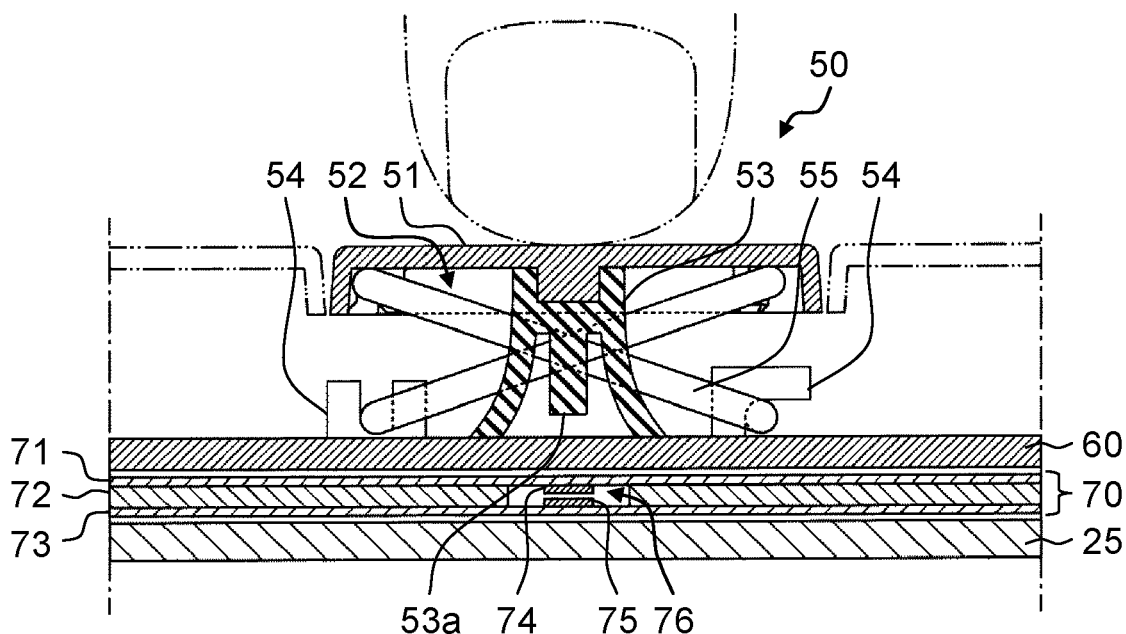
FIG. 9A is a figure viewing from the arrow direction of line A-A of FIG. 1 in the fifth to eighth embodiments, in the state where the key is not depressed.

FIG. 9A is a figure viewing from the arrow direction of line A-A of FIG. 1, in the state where the key is not depressed. FIG. 9A concretely shows only one key 50 among multiple keys 50 with a solid line for convenience.

Input device 40 has multiple keys 50, electrode sheet 60, and membrane switch sheet 70, all disposed on the top surface of top cabinet 25 of main unit 10. Keys 50, electrode sheet 60, and membrane switch sheet 70 are disposed in this order on the top surface of top cabinet 25 of main unit 10.

The fifth embodiment, therefore, is different from the first embodiment in that membrane switch sheet 70 is disposed between electrode sheet 60 and top cabinet 25.

Electrode sheet 60, a rectangular sheet (panel) component made of resin or glass, is configured to change the capacitance at a position that an object such as a finger has approached. Electrode sheet 60 contains n pieces of X-directional electrodes and m pieces of Y-directional electrodes. Each of the X-directional electrodes extends substantially parallel with the widthwise direction of electrode sheet 60. Each of the Y-directional electrodes extends substantially parallel with the heightwise direction of electrode sheet 60. Note that electrode sheet 60 has elasticity so as to be flexurally deformed downward when a load is exerted from above. The sheet (panel) is made of resin or glass that has such elasticity.

Membrane switch sheet 70 has a three-layer structure made of top sheet 71, middle sheet 72, and bottom sheet 73, all bonded together. Top sheet 71, middle sheet 72, and bottom sheet 73 are formed of a material such as resin and rubber. Middle sheet 72 has holes formed therein correspondingly to the layout of key 50. Each hole has switch 76 including upper contact 74 and lower contact 75 disposed therein. Upper contact 74 of switch 76 is formed on the inner surface of top sheet 71 by printing for example. Lower contact 75 of switch 76 is formed on the inner surface of bottom sheet 73 by printing for example. Top sheet 71 and bottom sheet 73 have a metal wiring pattern to be connected to upper contact 74 and lower contact 75 formed thereon by printing for example. In the state where key 50 is not depressed, upper contact 74 and lower contact 75 are vertically spaced from each other, and switch 76 is in the off state.

Figure 9B:
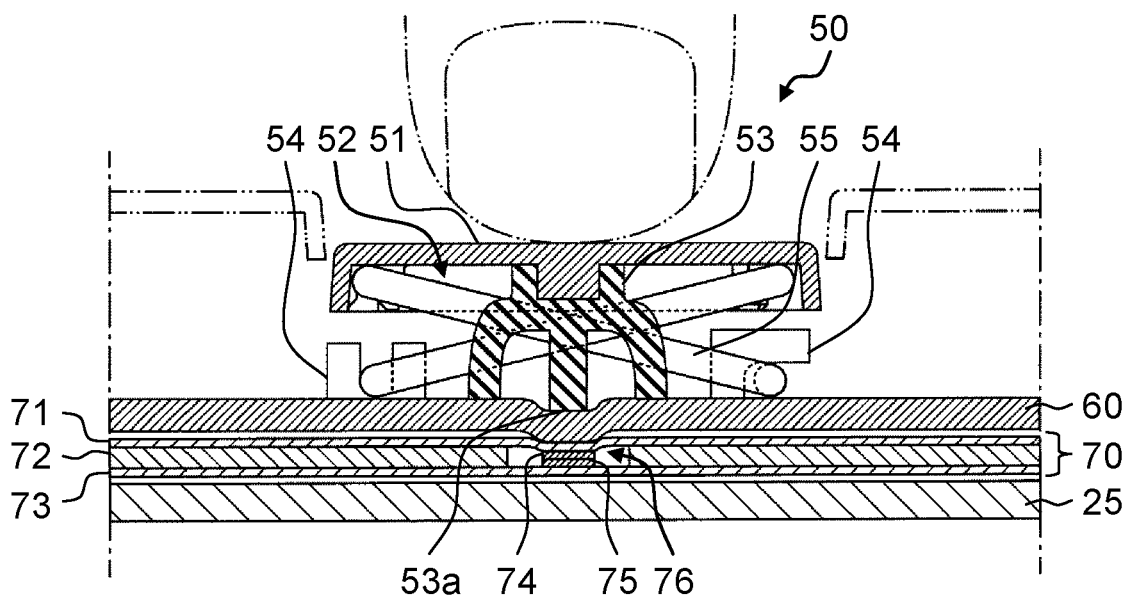
FIG. 9B is a figure viewing from the arrow direction of line A-A of FIG. 1 in the fifth to eighth embodiments, in the state where the key is depressed.

FIG. 9B is a figure viewing from the arrow direction of line A-A of FIG. 1, in the state where the key is depressed. FIG. 9B concretely shows only one key 50 among multiple keys 50 with a solid line for convenience.

When key top 51 is depressed by a user's finger against an upward urging force caused by rubber cup 53 and rubber cup 53 is compressed, downward projection 53a of rubber cup 53 contacts electrode sheet 60, which is then flexurally deformed downward. When electrode sheet 60 is deformed downward, upper contact 74 of membrane switch sheet 70 corresponding to key top 51 depressed moves downward to contact lower contact 75, and switch 76 enters the on state.

When key top 51 is depressed to the height position (given height position) shown in FIG. 9B, the user's finger approaches electrode sheet 60. At this moment, the capacitance at a position (a position on the flat surface) corresponding to relevant key 50 in electrode sheet 60 increases with respect to the capacitance when an object such as a finger is absent around key top 51 (referred to as the normal state). The change amount of the capacitance at this moment becomes second given amount X2 (described later). Here, even when a user's finger approaches key top 51 close enough to contact key top 51, the capacitance at a position corresponding to relevant key 50 in electrode sheet 60 increases with respect to the capacitance when an object such as a finger is absent around key top 51 (the normal state). The change amount of the capacitance at this moment becomes first given amount X1 (described later).

Figure 10:
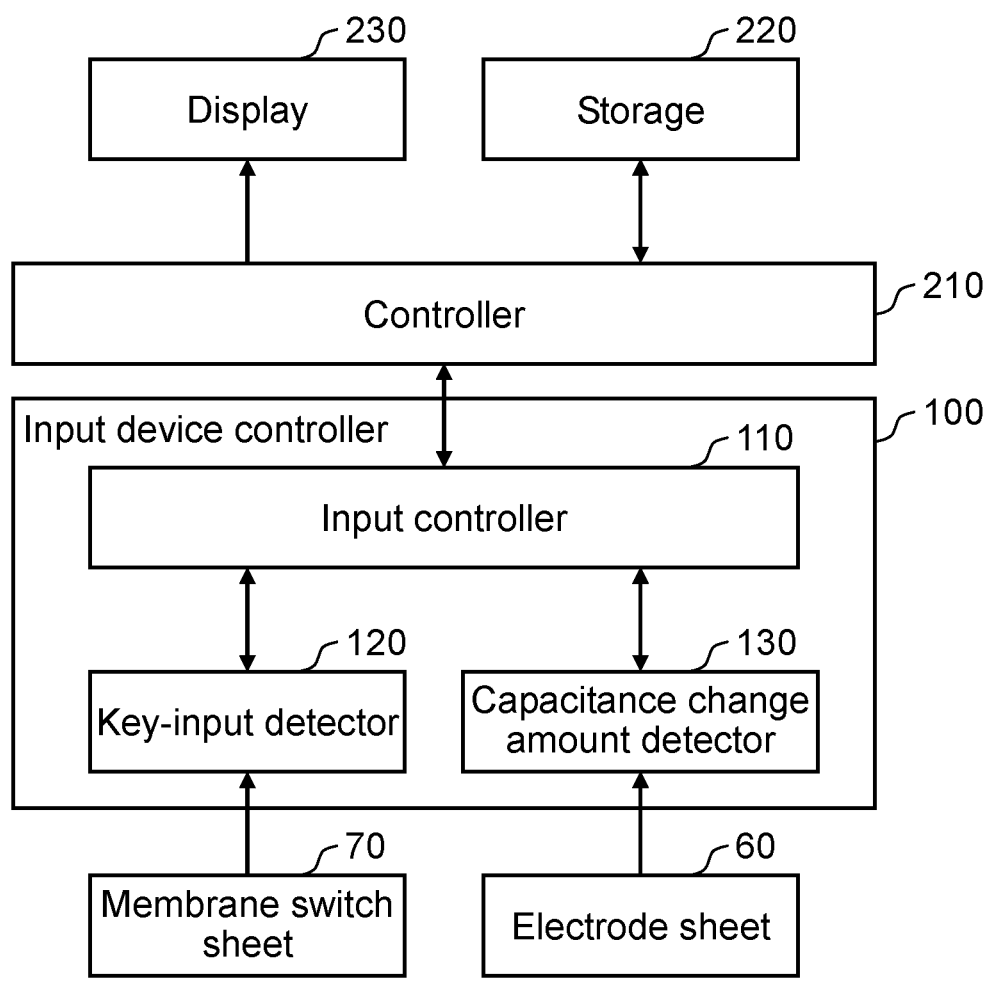
FIG. 10 is a block diagram illustrating the electrical configuration of the computer according to the fifth embodiment.

FIG. 10 is a block diagram indicating the electrical configuration of computer 5 according to the first embodiment.

In the fifth embodiment, input device controller 100 includes key-input detector 120, capacitance change amount detector 130, and input controller 110.

Key-input detector 120 outputs information (hereinafter, referred to as "key information" as appropriate) indicating key 50 corresponding to switch 76 in the on state.

Input controller 110 receives an input of positional information and capacitance change amount X from capacitance change amount detector 130, as well as key information from key-input detector 120. Input controller 110 outputs positional information and key information based on capacitance change amount X, positional information received, and key information received. The following provides a detailed description about control by input controller 110 of input device controller 100.

2-2. Operation

Figure 11:
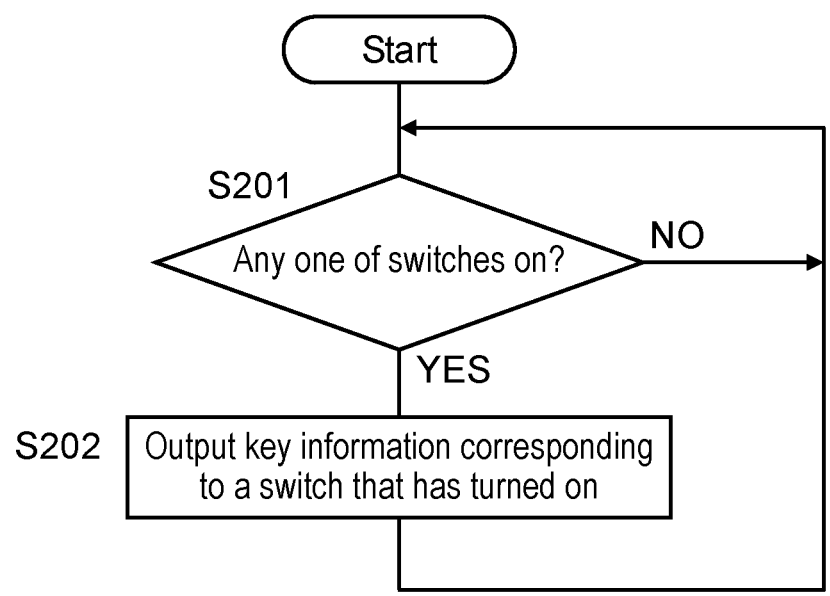
FIG. 11 is a flowchart illustrating the output control of key information by the input controller of the input device controller according to the fifth embodiment.

FIG. 11 is a flowchart illustrating output control of key information by input controller 110 of input device controller 100 according to the fifth embodiment.

If key information is input from key-input detector 120 (Yes in S201), input controller 110 of input device controller 100 outputs key information about the key that has been input (S202). If key information has not been input (No in S201), input controller 110 does not especially performs any process.

Figure 12:
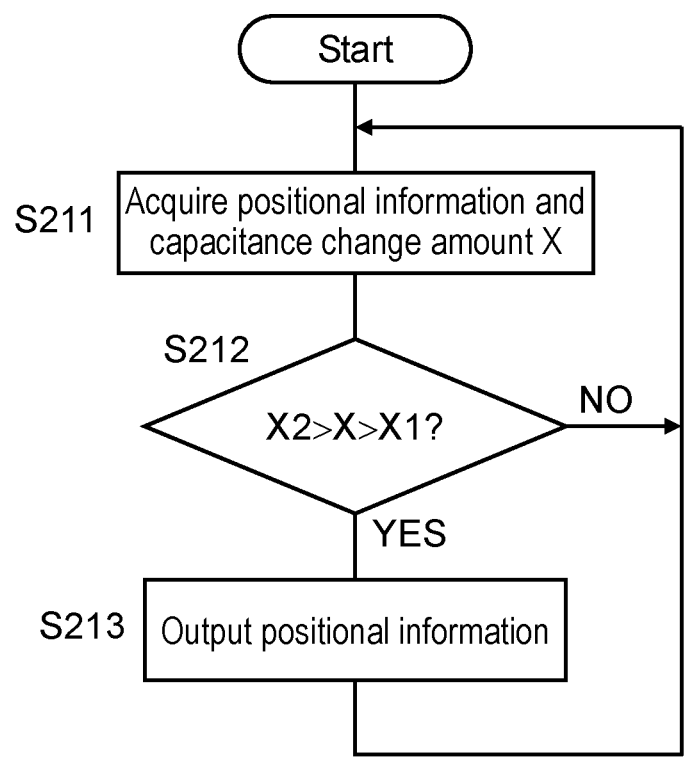
FIG. 12 is a flowchart illustrating the output control of positional information by the input controller of the input device controller according to the fifth embodiment.

FIG. 12 is a flowchart illustrating output control of positional information by input controller 110 of input device controller 100 according to the fifth embodiment. The process of input controller 110 based on this flowchart is executed in constant periods.

Input controller 110 of input device controller 100 acquires positional information and information on capacitance change amount X from capacitance change amount detector 130 (S211).

If capacitance change amount X acquired is smaller than second given amount X2 and larger (within a predetermined range) than first given amount X1 (Yes in S212), input controller 110 outputs positional information acquired (S213). If capacitance change amount X acquired is not within the predetermined range (No in S212), input controller 110 does not output positional information acquired. Here, first given amount X1 is a capacitance change amount produced when the user's finger approaches the top surface of key 50 close enough to contact it. Second given amount X2 is a capacitance change amount produced when key top 51 is depressed by a given stroke with the user's finger. The given stroke is a stroke produced when key top 51 is intentionally depressed with the user's finger against an upward urging force due to the elasticity of rubber cup 53. In other words, the given stroke is a stroke that results in a height position immediately before upper contact 74 and lower contact 75 of switch 76 contacts each other, that is immediately before switch 76 enters the on state.

When receiving key information or positional information from input controller 110, controller 210 of computer 1 performs a process corresponding to key information or positional information received. For example, when receiving key information, controller 210 generates a character based on the key information. Instead, key 50 indicated by key information is a special key such as a Return key and a Function key, controller 210 of computer 1 executes control corresponding to the special key operated.

When receiving positional information from input controller 110, controller 210 of computer 1 performs control to move the cursor (arrow indication) to a position corresponding to the positional information received for example. Besides, when continuously receiving positional information with its position continuously changing during operation of a browser or a document creation application, controller 210 of computer 1 scrolls the screen of the browser or the document creation application.

FIG. 5 schematically shows an example of operation of computer 1 according to the first embodiment.

A description is made of a case where a user slides a finger along the top surfaces of key tops 51 over multiple keys 50 of input device 40 in a W-shaped way. Capacitance change amount X at the position where the user slides the finger is larger than first given amount X1. Resultingly, input controller 110 successively outputs positional information indicating the position of the finger moving in a W-shaped way at the intervals of executing the process of the flowchart. Controller 210 of computer 1 moves the position of the cursor indicator on the screen of display 230 based on positional information output from input controller 110.

When any one of keys 50 is depressed while a document creation application is running on computer 1 for example, key information corresponding to key 50 depressed is output from input controller 110. Controller 210 of computer 1 generates a character based on the key information output from input controller 110 and makes display 230 display the character on the screen of the application.

Here, this embodiment does not include a touchpad or a touchpad on-off switch that used to be provided in a previous notebook computer, which allows downsizing main unit 10 of computer 1. A computer without downsizing required may be provided with a touchpad and a touchpad on-off switch as in the conventional way.

An input device of PTL 1 has a membrane switch sheet disposed above the electrode sheet as described above. In this case, the capacitance of the electrode sheet can not change appropriately due to metal switches and wiring inside the membrane switch sheet. Input device 40 of this embodiment, however, is provided with a membrane switch sheet under electrode sheet 60. This suppresses the above problem, and capacitance change amount Xi can be appropriately detected using electrode sheet 60. This allows outputting positional information indicating a position that an object such as a finger has approached based on capacitance change amount Xi detected.

Sixth Exemplary Embodiment

Hereinafter, a description is made of the sixth exemplary embodiment in reference to some drawings.

When key 50 is depressed in the above-described fifth embodiment, positional information is output from input controller 110 after capacitance change amount X has exceeded first given amount X1 until capacitance change amount X becomes equal to or larger than second given amount X2. In this case, when key 50 is depressed, the cursor can move to a position corresponding to key 50 depressed, which may annoy the user. The six to eighth embodiments present techniques capable of handling this problem.

Figure 13:
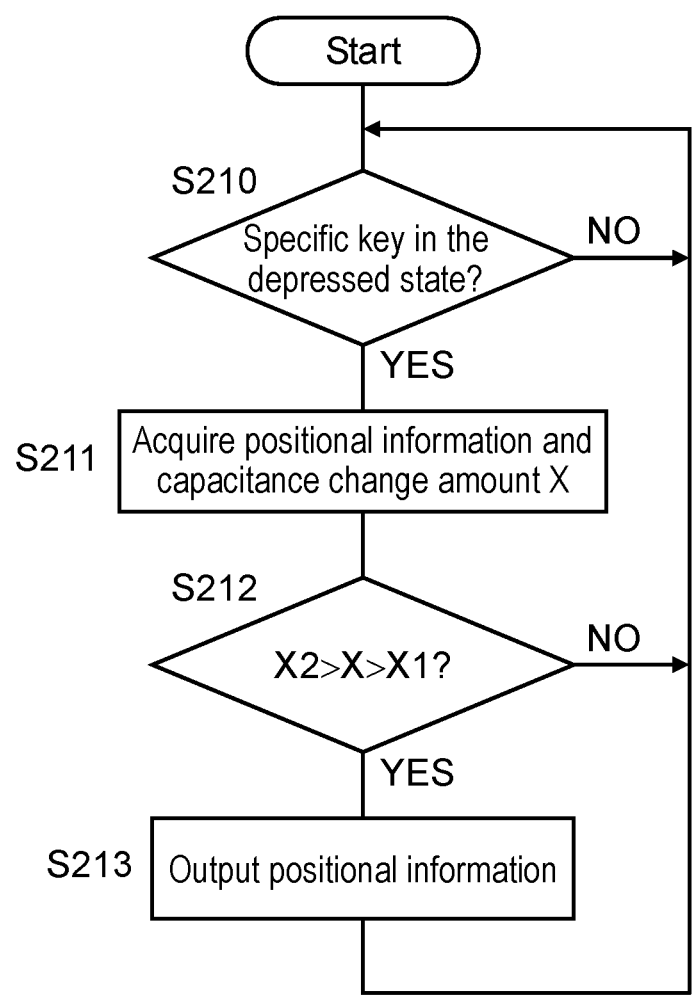
FIG. 13 is a flowchart illustrating the output control of positional information by the input controller of the input device controller according to the sixth embodiment.

FIG. 13 is a flowchart illustrating output control of positional information by input controller 110 of input device controller 100 according to the sixth embodiment. The process of input controller 110 based on this flowchart is executed in constant periods.

This embodiment has the process of step S210 added to the fifth embodiment. In steps S211 to S213, the same processes as those of the fifth embodiment are executed. Hereinafter, different processes are mainly described.

In step S210, input controller 110 of input device controller 100 determines whether or not specific key 50 is in the depressed state. Specific key 50 is a special key such as a Control key. Specific key 50 is an example of a given operation unit. The state where specific key 50 is depressed is an example of a given operation state. Whether or not specific key 50 is in the depressed state can be determined by whether or not a switch corresponding to specific key 50 has entered the on state in membrane switch sheet 70. The given operation unit may be a button or key specially provided. If specific key 50 is in the depressed state (Yes in S210), input controller 110 executes the process of step S211; otherwise (No in S210), does not execute the processes of step S211 and after.

According to this embodiment, positional information is to be output only when specific key 50 is in the depressed state. This prevents input device 40 from being worked as a pointing device when a user desires only to input characters.

Seventh Exemplary Embodiment

Hereinafter, a description is made of the seventh exemplary embodiment in reference to some drawings.

Figure 14:
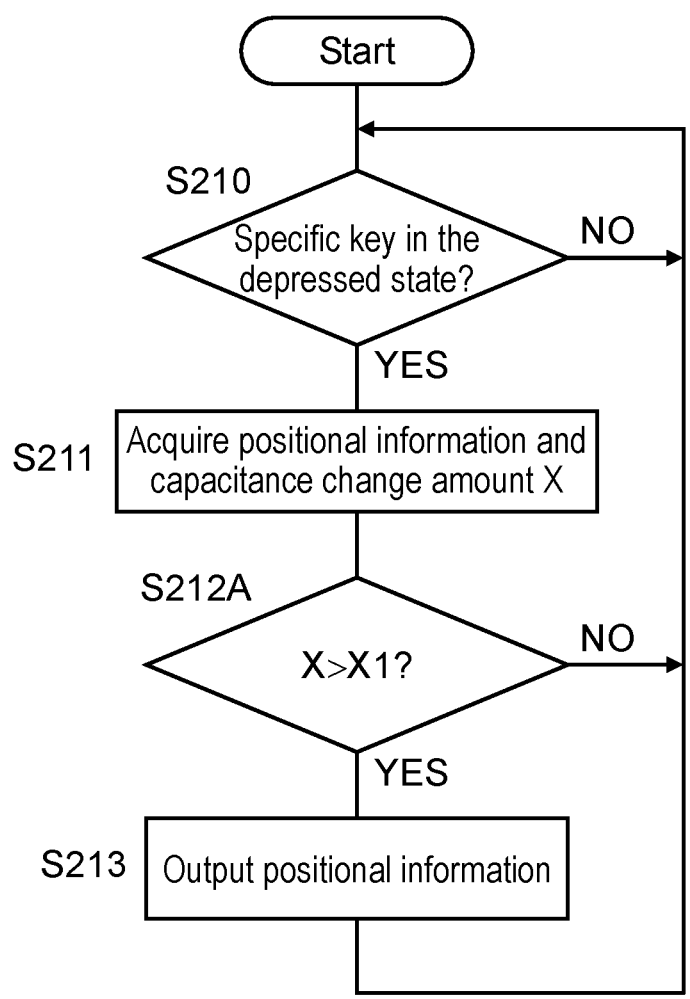
FIG. 14 is a flowchart illustrating the output control of positional information by the input controller of the input device controller according to the seventh embodiment.

FIG. 14 is a flowchart illustrating output control of positional information by input controller 110 of input device controller 100 according to the seventh embodiment. The process of input controller 110 based on this flowchart is executed in constant periods.

In this embodiment, the process of step S212A is executed instead of the process of step S212 in the sixth embodiment. In steps S210, S211, and S213, the same processes as those of the sixth embodiment are executed. Hereinafter, different processes are mainly described.

In step S212A, input controller 110 of input device controller 100 determines whether or not capacitance change amount X acquired from capacitance change amount detector 130 is larger than first given amount X1 described above.

If larger than first given amount X1 (Yes in S212A), input controller 110 outputs positional information acquired (S213); otherwise (No in S212A), does not output positional information acquired, but returns to the process of step S210. Here, first given amount X1 is a capacitance change amount produced when the user's finger lightly contacts the top surface of key top 51 in the same way as the sixth embodiment.

According to this embodiment, positional information is output if capacitance change amount X acquired from capacitance change amount detector 130 is larger than first given amount X1. This allows executing the pointing function when a user deeply depresses key 50, as well as when the user lightly contacts the top surface of key top 51 with a finger to the degree that the user lightly slides the finger along the top surface. When specific key 50 is in the depressed state, the user can possibly attempt to mainly use the pointing function; however, key 50 can be pressed unconsciously while the pointing function is being used. Even in such a case, this embodiment outputs positional information.

Eighth Exemplary Embodiment

Hereinafter, the eighth exemplary embodiment is described.

In the fifth to seventh embodiments, when key information is input from key-input detector 120, input device controller 100 outputs the key information to controller 210 regardless of whether or not specific key 50 is in the depressed state. If specific key 50 is in the depressed state, however, input device controller 100 may be configured to skip the processes of the flowcharts in FIGS. 11, 13, and 14. With this configuration, key information is not output when specific key 50 is in the depressed state; is output only not in the depressed state. In other words, depressing specific key 50 allows input device 40 only to be worked as a pointing device for inputting positional information. On the contrary, not depressing specific key 50 allows input device 40 only to be worked as a key-input device only for inputting characters.

3. Advantages (1) Input device 40 of the first and second embodiments includes electrode sheet 60, multiple keys 50, and input device controller 100 (an example of a controller). Electrode sheet 60 changes its capacitance at a position, among given positions on the sheet surface, that an object has approached. Keys 50 are depressibly disposed on electrode sheet 60.

Input device controller 100 (i) detects capacitance change amount Xi at multiple positions of electrode sheet 60, (ii) outputs positional information indicating a position, among the multiple positions, where capacitance change amount Xi detected satisfies a first given condition, and (iii) outputs key information indicating key 50 corresponding to a position, among the multiple positions, where capacitance change amount Xi detected satisfies the second given condition.

Input device 40 of this embodiment eliminates the need for a membrane switch sheet. This results in the absence of a membrane switch sheet between fingers of a user operating keys and electrode sheet 60. Accordingly, capacitance change amount Xi can be detected appropriately using electrode sheet 60. Hence, key information indicating a key and positional information indicating a position that an object has approached (e.g., a finger) can be appropriately output based on capacitance change amount Xi. Also, the absence of a membrane switch sheet simplifies the structure of input device 40.

(2) In input device 40 of the second to fourth embodiments, input device controller 100 outputs positional information only when specific key 50 (an example of a given operation unit) is in the depressed state (an example of given operation state).

Thus, positional information is output only when specific key 50 is in the depressed state. This prevents input device 40 from being worked as a pointing device when a user desires only to input characters.

(3) In input device 40 of the third and fourth embodiments, input device controller 100 outputs key information only when specific key 50 (a given operation unit) is not in the depressed state (a given operation state).

Thus, not depressing specific key 50 allows input device 40 only to be worked as a key-input device only for inputting characters.

(4) In input device 40 of the first to third embodiments, the first given condition is that maximum capacitance change amount X (Xm) among multiple capacitance change amounts Xi is larger than first given amount X1 and at the same time smaller than second given amount X2 larger than first given amount X1.

The second given condition is that maximum capacitance change amount X (Xm) among multiple capacitance change amounts Xi is larger than second given amount X2.

First given amount X1 is a capacitance change amount produced when a user's finger as an object has approached the top surface of key 50 close enough to contact it.

Second given amount X2 is a capacitance change amount produced when key 50 is depressed to a given height position with a user's finger.

Herewith, positional information is output when a user's finger as an object is between a position where the finger has approached the top surface of key 50 close enough to contact it and a position where key 50 is depressed to a position immediately before a given height position. Meanwhile, if key 50 is further depressed with the user's finger, positional information ceases to be output; instead, key information is output. That is, positional information and key information are not output simultaneously.

(5) In input device 40 of the fourth embodiment, the first given condition is that maximum capacitance change amount X (Xm) among multiple capacitance change amounts Xi is larger than first given amount X1.

The second given condition is that maximum capacitance change amount X (Xm) among multiple capacitance change amounts Xi is larger than second given amount X2 larger than first given amount X1.

First given amount X1 is a capacitance change amount produced when a user's finger as an object has approached the top surface of key 50 close enough to contact it.

Second given amount X2 is a capacitance change amount produced when key 50 is depressed to a given height position with user's finger.

Herewith, by making a user's finger as an object approach the top surface of key 50 close enough to contact it in the state where specific key 50 is depressed, positional information can be made to be output. That is, the pointing function can be made to be executed. Especially when specific key 50 is in the depressed state, the user can possibly attempt to mainly use the pointing function; however, the user can press in key 50 unconsciously while using the pointing function. In this embodiment, positional information is to be output even in such a case, which increases user's convenience.

(6) In input device 40 of the first to fourth embodiment, each of keys 50 is configured to be depressible with pantograph mechanism 52.

This configuration helps stabilize up/down movement of key 50 when key 50 is depressed, and so does control based on capacitance change amount X.

(7) Computer 1 (an electronic apparatus) of the first to fourth embodiments includes input device 40 of the embodiments.

This provides the advantages due to input device 40 described above in computer 1 (an electronic apparatus).

(8) Input device 40 according to the fifth to eighth embodiments includes electrode sheet 60, multiple keys 50, membrane switch sheet 70, and input device controller 100 (an example of a controller). Electrode sheet 60 changes its capacitance at a position, among given positions on the sheet surface, that an object has approached. Keys 50 are depressibly disposed on electrode sheet 60. Membrane switch sheet 70 is disposed under electrode sheet 60. Membrane switch sheet 70 has multiple switches 76 that enter the on state when a corresponding key among keys 50 is depressed.

Input device controller 100 (i) outputs key information indicating key 50 corresponding to switch 76, among switches 76, that has entered the on state, and (ii) detects capacitance change amount Xi at positions on electrode sheet 60 and outputs positional information indicating a position, among the positions, where capacitance change amount Xi detected satisfies a given condition.

Input device 40 of this embodiment has membrane switch sheet 70 disposed under electrode sheet 60. This results in the absence of membrane switch sheet 70 between fingers of a user operating keys 50 and electrode sheet 60. Accordingly, capacitance change amount Xi can be detected appropriately using electrode sheet 60. Hence, key information indicating key 50 and positional information indication a position that an object (e.g., a finger) has approached can be appropriately output based on capacitance change amount Xi detected.

(9) In input device 40 of the sixth to eighth embodiments, input device controller 100 outputs positional information only when specific key 50 (an example of a given operation unit) is in the depressed state (an example of a given operation state).

Thus, positional information is output only when specific key 50 is in the depressed state. This prevents input device 40 from being worked as a pointing device when a user desires only to input characters.

(10) In input device 40 of the eighth embodiment, input device controller 100 outputs key information only when specific key 50 is not in the depressed state.

Thus, not depressing specific key 50 allows input device 40 only to be worked as a key-input device only for inputting characters.

(11) In input device 40 of the fifth, sixth, and eighth embodiments, the given condition is that maximum capacitance change amount X (Xm) among multiple capacitance change amounts Xi at multiple positions is larger than first given amount X1 and at the same time smaller than second given amount X2 larger than first given amount X1.

First given amount X1 is a capacitance change amount produced when a user's finger as an object has approached the top surface of key 50 close enough to contact it.

Second given amount X2 is a capacitance change amount detected when key 50 is depressed to the height position to the extent of switch 76 immediately before entering the on state.

Herewith, positional information is output when a user's finger as an object is between a position that the finger has approached the top surface of key 50 close enough to contact it; and a height position to which key 50 is depressed to the extent of switch 76 immediately before entering the on state. Meanwhile, if key 50 is depressed with the user's finger to the extent of switch 76 entering the on state, positional information is not output. That is, positional information and key information are not output simultaneously.

(12) In input device 40 of the seventh and eighth embodiments, the given condition is that maximum capacitance change amount X (Xm) among capacitance change amounts Xi at multiple positions is larger than second given amount X2 (a given amount).

Second given amount X2 (a given amount) is a capacitance change amount detected when the user's finger as an object has approached the top surface of key 50 close enough to contact it.

Herewith, by making a user's finger as an object approach the top surface of key 50 close enough to contact it in the state where specific key is depressed, positional information can be made to be output. That is, the pointing function can be made to be executed. Especially when specific key 50 is in the depressed state, the user can possibly attempt to mainly use the pointing function; however, the user can press in key 50 unconsciously while using the pointing function. Even in such a case, this embodiment outputs positional information, which increases user's convenience.

(13) In input device 40 of the fifth to eighth embodiments, each of multiple keys 50 is configured to be depressible with pantograph mechanism 52.

This configuration helps stabilize up/down movement of key 50 when key 50 is depressed, and so does control based on capacitance change amount X.

(14) Computer 1 (an electronic apparatus) of the fifth to eighth embodiments includes input device 40 of the embodiments.

This provides the advantages due to input device 40 described above in computer 1 (an electronic apparatus).

OTHER EMBODIMENTS

Hereinbefore, the embodiments are described to exemplify the technology disclosed in this application. The technology of the disclosure, however, is not limited to this embodiment, but is applicable to other embodiments appropriately devised through modification, substitution, addition, and omission for example.

Hereinafter, other exemplary embodiments are described.

(1) Computer 1 of each of the embodiments has input device controller 100 separately from controller 210 of computer 1. In the present disclosure, however, at least one of input controller 110 and capacitance change amount detector 130, both composing input device controller 100, may be configured integrally with controller 210 of computer 1. Similarly in the fifth to eighth embodiments, at least one of input controller 110, key-input detector 120, and capacitance change amount detector 130, all composing input device controller 100, may be configured integrally with controller 210 of computer 1.

(2) In each of the embodiments, the description is made of a case where an input device according to the disclosure is applied as part of computer 1. An input device according to the disclosure, however, is applicable to a single keyboard device as well, not as part of computer 1.

(3) In each of the embodiments, input device 40 has pantograph mechanism 52; however, a pantograph mechanism is not essential for an input device of the present disclosure.

(4) In each of the embodiments, input device 40 outputs positional information at a position that has maximum capacitance change amount Xi detected among multiple positions; however, the present disclosure is not limited to this way. In an input device of the present disclosure, the following way may be used. That is, the position of an object such as a finger among multiple positions is specified based on the distribution of multiple capacitance change amounts Xi detected, and at the same time the value of capacitance change amount X is determined based on the relevant distribution.

(5) In each of the embodiments, outputting of positional information is restricted when specific key 50 is in the depressed state. However, outputting of positional information may be restricted when specific key 50 remains touched for a given time (e.g., 2 seconds) or longer, or when specific key 50 is touched twice or three times within a given short time (e.g., 1 second). It is simply required to detect a touch operation based on the capacitance change amount described above.

Hereinbefore, the embodiments are described to exemplify the technology disclosed in this application. For this reason, the accompanying drawings and detailed descriptions are provided.

Accordingly, some components described in the detailed descriptions and accompanying drawings may include, besides what is essential for solving problems, what is not essential in order to exemplify the above-described technologies. Hence, the fact that such inessential components are included in the accompanying drawings and the detailed descriptions does not mean that such inessential components are immediately acknowledged as essential.

The above-described embodiments are for exemplification of the technologies in the disclosure. Hence, the embodiments may undergo various kinds of change, substitution, addition, and/or omission within the scope of the claims and their equivalent technology.

INDUSTRIAL APPLICABILITY

The present disclosure can be widely used for input devices and electronic apparatuses including the input devices.

What is claimed is:

1. An input device comprising:
    an electrode sheet directly sensing a change in capacitance at a position where an object approaches when the object approaches the electrode sheet;
    a plurality of keys disposed on the electrode sheet and configured to be depressed; and
    a controller configured to:
    detect (i) a capacitance change amount at a position of one key of the plurality of keys on the electrode sheet and (ii) a capacitance change amount at a position of a specific key of the plurality of keys,
    output, in response to (i) the detected capacitance change amount at the position of the one key being larger than a first given amount and smaller than a second given amount larger than the first given amount and (ii) the detected capacitance change amount at the position of the specific key being equal to or larger than the second given amount, positional information indicating the position of the one key, and
    output, in response to (i) the detected capacitance change amount at the position of the one key being equal to or larger than the second given amount, key information indicating the one key.

2. The input device of claim 1, wherein the controller outputs the positional information only when a given operation unit is in a given operation state.

3. The input device of claim 2, wherein the controller outputs the key information only when the given operation unit is not in the given operation state.

4. The input device of claim 1, wherein
    the first given amount is a capacitance change amount detected when a user's finger as the object has approached a top surface of the one key close enough to contact the top surface, and
    the second given amount is a capacitance change amount detected when the one key is depressed to a given height position with the user's finger.

5. The input device of claim 1, wherein each of the plurality of keys is configured to be depressed with a pantograph mechanism.

6. The input device of claim 5, wherein each of the plurality of keys includes:
    a key top formed of resin, and
    a rubber cup between the key top and the electrode sheet.

7. The input device of claim 6, wherein the rubber cup includes:
    two legs fastened to the electrode sheet, and
    a projection between the two legs.

8. The input device of claim 7, wherein the projection is shorter than each of the two legs.

9. An electronic apparatus including the input device of claim 1.

10. An input device comprising:
    an electrode sheet directly sensing a change in capacitance at a position where an object approaches when the object approaches the electrode sheet;
    a plurality of keys disposed on the electrode sheet and configured to be depressed; and
    a controller configured to:
    detect (i) a capacitance change amount at a position of one key of the plurality of keys on the electrode sheet and (ii) a capacitance change amount at a position of a specific key of the plurality of keys,
    output, in response to (i) the detected capacitance change amount at the position of the one key being larger than a first given amount and smaller than a second given amount larger than the first given amount and (ii) the detected capacitance change amount at the position of the specific key being equal to or larger than the second given amount, positional information indicating the position of the one key, and
    output, in response to (i) the detected capacitance change amount at the position of the one key being equal to or larger than the second given amount and (ii) the detected capacitance change amount at the position of the specific key being smaller than the second given amount, key information indicating the one key.

11. An electronic apparatus including the input device of claim 10.

* * * * *